(12) United States Patent
Choi

(10) Patent No.: US 10,672,434 B2
(45) Date of Patent: Jun. 2, 2020

(54) STORAGE DEVICE AND METHOD OF OPERATING THE SAME

(71) Applicant: SK hynix Inc., Gyeonggi-do (KR)

(72) Inventor: Hyoung Pil Choi, Gyeonggi-do (KR)

(73) Assignee: SK hynix Inc., Gyeonggi-Do (KR)

( * ) Notice: Subject to any disclaimer, the term of this patent is extended or adjusted under 35 U.S.C. 154(b) by 0 days.

(21) Appl. No.: 16/140,996

(22) Filed: Sep. 25, 2018

(65) Prior Publication Data
US 2019/0259428 A1 Aug. 22, 2019

(30) Foreign Application Priority Data

Feb. 21, 2018 (KR) .......................... 10-2018-0020753

(51) Int. Cl.
| | |
|---|---|
| *G11C 5/14* | (2006.01) |
| *G11C 8/08* | (2006.01) |
| *G11C 16/30* | (2006.01) |
| *G11C 16/20* | (2006.01) |
| *G11C 16/08* | (2006.01) |
| *G11C 16/22* | (2006.01) |

(52) U.S. Cl.
CPC .............. *G11C 5/148* (2013.01); *G11C 8/08* (2013.01); *G11C 16/08* (2013.01); *G11C 16/20* (2013.01); *G11C 16/225* (2013.01); *G11C 16/30* (2013.01)

(58) Field of Classification Search
CPC ....................................... G11C 16/30
USPC ........................................... 365/226
See application file for complete search history.

(56) References Cited

U.S. PATENT DOCUMENTS

| | | | | |
|---|---|---|---|---|
| 5,586,287 | A | * 12/1996 | Okumura ............. | G11C 11/406 365/222 |
| 6,111,807 | A | * 8/2000 | Ooishi ................ | G11C 7/22 365/189.05 |
| 2004/0105324 | A1* | 6/2004 | Sakurai ............... | G11C 16/225 365/200 |
| 2013/0054871 | A1* | 2/2013 | Lassa .................. | G06F 3/061 711/103 |

FOREIGN PATENT DOCUMENTS

| | | |
|---|---|---|
| KR | 1020140051685 | 5/2014 |
| KR | 1020160054238 | 5/2016 |

\* cited by examiner

*Primary Examiner* — Min Huang
(74) *Attorney, Agent, or Firm* — IP & T Group LLP

(57) ABSTRACT

A storage device includes a memory device configured to store voltage drop information indicating whether a voltage drop occurred in a supply voltage while the operation is performed; and a memory controller configured to provide, to the memory device, a status read command for requesting a result of the performing of the operation, and determine whether the operation has passed, based on the voltage drop information included in a status read response provided from the memory device in response to the status read command.

13 Claims, 14 Drawing Sheets

STORAGE DEVICE AND METHOD OF OPERATING THE SAME

CROSS-REFERENCE TO RELATED APPLICATION

The present application claims priority under 35 U.S.C. § 119(a) to Korean patent application number 10-2018-0020753, filed on Feb. 21, 2018, which is incorporated herein by reference in its entirety.

BACKGROUND

1. Field of Invention

Various embodiments of the present disclosure generally relate to an electronic device, and more particularly, to a storage device and a method of operating the storage device.

2. Description of Related Art

Generally, a storage device is a device which stores data under control of a host device such as a computer, a smartphone, or a smartpad. The storage device may include a memory device configured to store data, and a memory controller configured to control the memory device. Such memory devices are classified into a volatile memory device and a nonvolatile memory device.

The volatile memory device is a memory device in which data stored therein is lost when power is interrupted. Representative examples of the volatile memory device include a static RAM (SRAM), a dynamic RAM (DRAM), a synchronous DRAM (SDRAM), etc.

The nonvolatile memory device is a memory device which retains data stored therein even when power is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the present disclosure are directed to a storage device capable of detecting a voltage drop, and a method of operating the storage device.

An embodiment of the present disclosure may provide for a memory device including: a memory cell array including a plurality of memory cells; a peripheral circuit configured to perform an operation on selected memory cells among the plurality of memory cells; a voltage drop information generating unit configured to generate voltage drop information indicating whether a voltage drop has occurred in a supply voltage input from an external device while the operation is performed; and a status register configured to store the voltage drop information.

An embodiment of the present disclosure may provide for a method for operating a memory controller, including: providing, to a memory device, a command corresponding to an operation; providing a status read command to the memory device when a preset time passes after the command is provided; receiving a status read response output from the memory device in response to the status read command; and determining whether the operation has passed or failed depending on voltage drop information included in the status read response. The voltage drop information may be information indicating whether a voltage drop has occurred in a supply voltage of the memory device while the operation is performed.

An embodiment of the present disclosure may provide for a memory controller including: a status read control unit configured to provide, when a preset time passes after a command corresponding to an operation is to provided to a memory device, a status read command to the memory device, and receive a status read response output from the memory device in response to the status read command; and a command control unit configured to perform an error processing operation for the operation based on voltage drop information included in the status read response.

An embodiment of the present disclosure may provide for a storage device including: a memory device configured to store voltage drop information indicating whether a voltage drop occurred in a supply voltage while the operation is performed; and a memory controller configured to provide, to the memory device, a status read command for requesting a result of the performing of the operation, and determine whether the operation has passed, based on the voltage drop information included in a status read response provided from the memory device in response to the status read command.

An embodiment of the present disclosure may provide for a memory system including: a memory device suitable for generating a voltage drop information according to detection of one between write and erase operations performed thereby, during which a voltage drop occurs therein; and a controller suitable for controlling the memory device to perform again the operation thereto based on reliability of data corresponding to the detected operation according to the voltage drop information.

DETAILED DESCRIPTION

Figure 1:
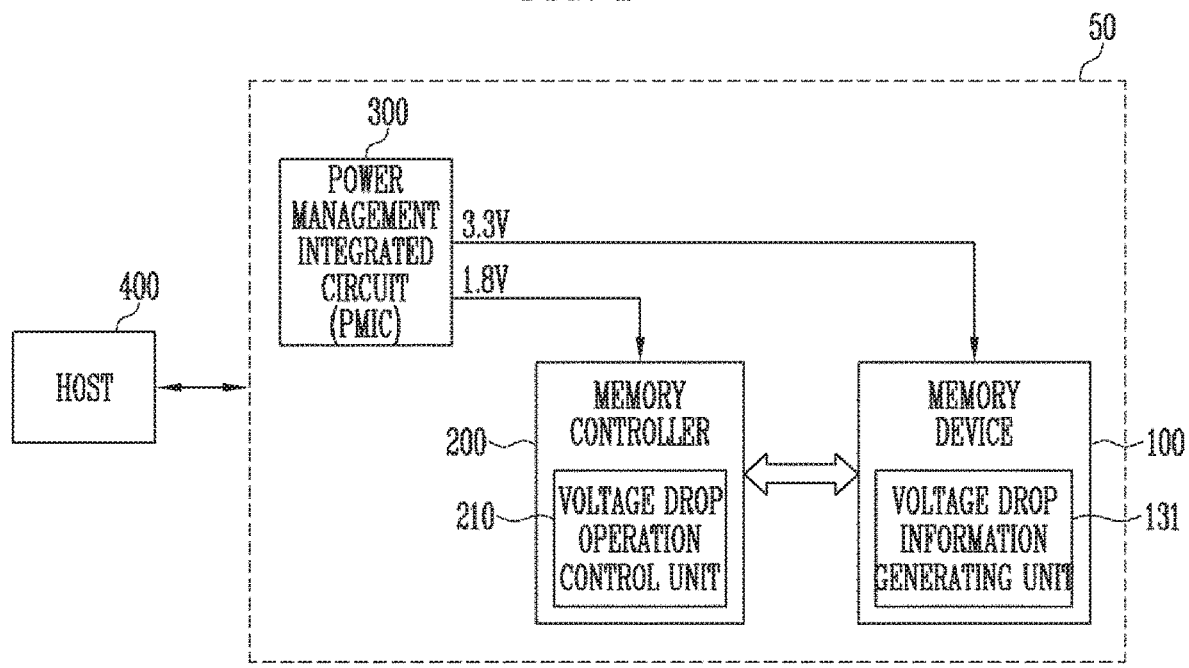
FIG. 1 is a diagram illustrating a storage device in accordance with an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a storage device 50 in accordance with an embodiment of the present disclosure.

Referring to FIG. 1, the storage device 50 may include a memory device 100, a memory controller 200, and a power management integrated circuit (PMIC) 300.

The PMIC 300 may provide voltages to the memory device 100 and the memory controller 200. In an embodiment, the voltages to be provided by the PMIC 300 may be 3.3 V and 1.8 V. For example, the PMIC 300 may provide a voltage of 1.8 V to the memory controller 200, and may provide a voltage of 3.3 V to the memory device 100. The voltages provided from the PMIC 300 to the memory device 100 and the memory controller 200 may be respectively supply voltages VCC for the memory device 100 and the memory controller 200.

The memory device 100 may store data therein. The memory device 100 may operate under control of the memory controller 200. The memory device 100 may include a memory cell array (not shown) including a plurality of memory cells configured to store data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM).

The memory device 100 may receive a command and an address from the memory controller 200 and access a region of the memory cell array which is selected by the address. In other words, the memory device 100 may perform an operation corresponding to the command on the region selected by the address. For example, the memory device 100 may perform a program operation, a read operation, and an erase operation. During a program operation, the memory device 100 may program data to the region selected by the address. During a read operation, the memory device 100 may read data from the region selected by the address. During an erase operation, the memory device 100 may erase data from the region selected by the address.

In an embodiment, each of the program operation and the read operation may be performed on a page basis, and the erase operation may be performed on a block basis.

The memory device 100 may receive a supply voltage VCC from the PMIC 300. The memory device 100 may receive a supply voltage VCC of 3.3 V. The memory device 100 may perform various management operations depending on variation in level of the supply voltage VCC so as to secure the operational reliability of the memory device 100.

For example, if the supply of the supply voltage from the PMIC 300 is suddenly cut off (hereinafter, this event will be referred to as "sudden power off (SPO)"), a defect, e.g., damage to data that is being programmed to the memory device 100, may be caused. Therefore, to safely retain data even if the SPO event occurs, the memory device 100 may monitor the level of the supply voltage VCC.

If the SPO event is expected by the level of the supply voltage VCC being lowered to a predetermined level or below, the memory device 100 may perform an operation of discharging voltages to be supplied to word lines WL and bit lines BL that are coupled to memory cells included in the memory device 100.

The memory device 100 may include a power on reset (POR) circuit to prevent a malfunction from occurring when the supply voltage VCC is supplied to the memory device 100. If the supply voltage VCC reaches a predetermined level when the supply voltage VCC is applied to the memory device 100, the POR circuit may provide a reset signal for initializing a flip-flop, a latch, a counter, a register, etc. that form the memory device 100. For example, if the supply voltage VCC reaches a predetermined level during power-on, the memory device 100 may output an enabled reset signal. Subsequently, if the supply voltage VCC reaches a normal operating voltage level, the reset signal is disabled. In response to the enabled reset signal, internal components of the memory device 100 may be reset to an initial status. The POR circuit may also detect the level of the supply voltage VCC.

When the memory device 100 performs a program operation, a read operation, or an erase operation, power consumption may be increased, compared to that of the case where the memory device 100 is in an idle status. Particularly, when a plurality of memory devices 100 are coupled to a single memory controller 200 and the PMIC 300 supplies supply voltages VCC to the memory devices 100, power consumption may surge if the memory devices 100 perform operations at the same time. Here, if required power is not momentarily supplied to the PMIC 300, a voltage drop may be caused.

Such situation is not the case where it is impossible for the memory device 100 to operate, such as the SPO event. In other words, such situation may be the case where the memory device 100 undergoes the voltage drop just momentarily during a normal operation. However, such situation may reduce the reliability of an operation of the memory device 100 due to the momentary voltage drop.

In an embodiment of the present disclosure, the memory device 100 may generate voltage drop information indicating whether a voltage drop has occurred during an operation that is performed by the memory device 100, and may provide the generated voltage drop information to the memory controller 200.

To this end, the memory device 100 may include a voltage drop information generating unit 131. The voltage drop information generating unit 131 may include all circuits, systems, firmware and devices necessary for its operations and functions. The voltage drop information generating unit 131 may monitor the level of the supply voltage VCC. The voltage drop information generating unit 131 may detect a voltage drop by checking whether the level of the supply voltage VCC is lowered to a preset reference level. The reference level may be higher than another reference level used for determining the expectation of an SPO event.

When a voltage drop is detected, the voltage drop information generating unit 131 may store voltage drop information to a status register included in the memory device 100. The status register may store status information, which is information about an operating status of the memory device 100. The status information may include the voltage drop information. For example, if the voltage drop information is set, it may indicate that a voltage drop has occurred in the supply voltage VCC of the memory device 100 while an operation is performed. If the voltage drop information is released, it may indicate that a voltage drop has not occurred in the supply voltage VCC of the memory device 100 while an operation is performed. In an embodiment, the set voltage drop information may be indicated as '0', and the released voltage drop information may be indicated as '1'. Alternatively, the set voltage drop information may be indicated as '1', and the released voltage drop information may be indicated as '0'.

In response to a status read command received from the memory controller 200, the memory device 100 may provide, to the memory controller 200, the status information stored in the status register.

The memory controller 200 may control overall operation of the memory device 100. The memory controller 200 may control the operation of the memory device 100 in response to a request of a host 300 or regardless of the request of the host 300.

For example, the memory controller 200 may control the memory device 100 to perform a program operation, a read operation, or an erase operation in response to a request from the host 300. During the program operation, the memory controller 200 may provide a program command, an address, and data to the memory device 100. During the read operation, the memory controller 200 may provide a read command and an address to the memory device 100. During the erase operation, the memory controller 200 may provide an erase command and an address to the memory device 100.

In an embodiment, the memory controller 200 may autonomously generate a program command, an address and data without a request from the host 300, and transmit them to the memory device 100. For example, the memory controller 200 may provide a command, an address and data to the memory device 100 to perform background operations such as a program operation for wear leveling, or a program operation for garbage collection.

The memory controller 200 may execute firmware for controlling the memory device 100. In the case where the memory device 100 is a flash memory device, the memory controller 200 may manage firmware such as a flash translation layer (FTL) for controlling communication between the host 300 and the memory device 100. In detail, the memory controller 200 may translate a logical address included in a request from the host 300 into a physical address that is an address (ADD) to be provided to the memory device 100.

The memory controller 200 may further include a voltage drop operation control unit 210. The voltage drop operation control unit 210 may include all circuits, systems, firmware and devices necessary for its operations and functions.

The voltage drop operation control unit 210 may receive the voltage drop information provided from the memory device 100. For example, the voltage drop operation control unit 210 may provide a status read command to the memory device 100, and receive status information that is provided from the memory device 100 in response to the status read command. The status information received from the memory device 100 may include voltage drop information.

The voltage drop operation control unit 210 may determine whether a voltage drop has occurred while the memory device 100 performs an operation, depending on the voltage drop information. In other words, the voltage drop operation control unit 210 may determine whether a corresponding operation of the memory device 100 is a voltage drop operation during which a voltage drop has occurred.

If the operation performed by the memory device 100 is a voltage drop operation, the voltage drop operation control unit 210 may control the memory device 100 to perform an error processing operation for data corresponding to the voltage drop operation.

In an embodiment, if the voltage drop operation is a program operation, in order to determine whether data corresponding to the voltage drop operation has been successfully stored to the memory device 100, the voltage drop operation control unit 210 may provide, to the memory device 100, a read command for reading the programmed data corresponding to the voltage drop operation. If a read operation for reading the programmed data is successful, it may be determined that the voltage drop operation has been normally performed. However, if the read operation has failed, it may be determined that the voltage drop operation has been abnormally performed due to the voltage drop. In this case, the voltage drop operation control unit 210 may control the memory device 100 to re-perform the voltage drop operation or the program operation on another memory region.

In an embodiment, if the voltage drop operation is an erase operation, in order to determine whether a memory block has been normally erased according to the voltage drop operation, the voltage drop operation control unit 210 may provide a read command for the corresponding memory block to the memory device 100. A read voltage used in this case may be an erase verify voltage which is used in the erase operation. If the read operation using the erase verify voltage is successful, it may be determined that the voltage drop operation has been normally performed. If the read operation has failed, the voltage drop operation control unit 210 may control the memory device 100 to re-perform the voltage drop operation or the erase operation on the corresponding memory block.

In various embodiments, if the voltage drop operation is detected, the memory controller 200 may determine that the voltage drop operation has failed, without performing an error processing operation for data corresponding to the voltage drop operation.

The host 400 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
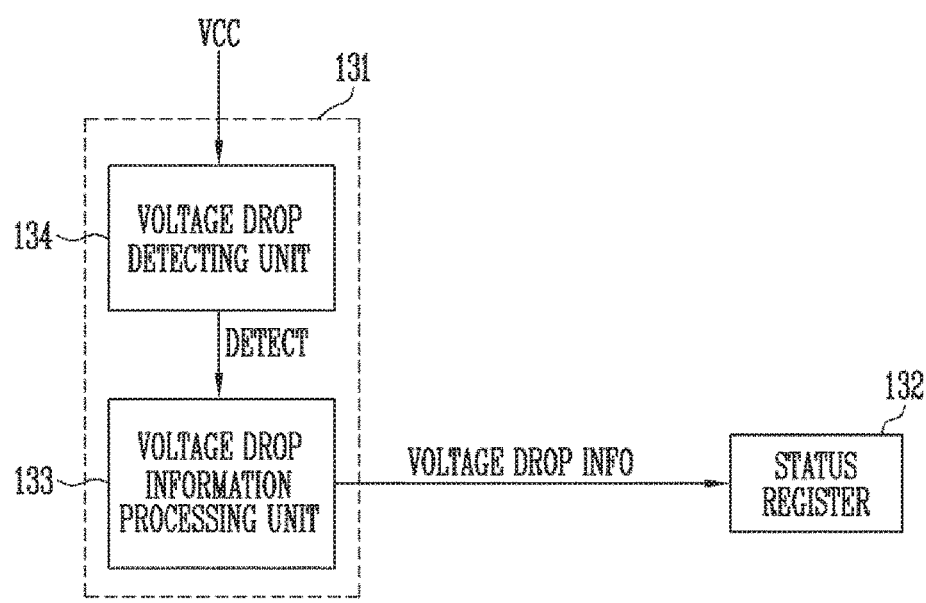
FIG. 2 is a block diagram illustrating an operation of a voltage drop information generating unit shown in FIG. 1.

FIG. 2 is a block diagram illustrating an operation of the voltage drop information generating unit 131 of FIG. 1.

Referring to FIG. 2, the voltage drop information generating unit 131 may include a voltage drop detecting unit 134 and a voltage drop information processing unit 133. The voltage drop detecting unit 134 and the voltage drop information processing unit 133 may include all circuits, systems, firmware and devices necessary for their respective operations and functions.

The voltage drop detecting unit 134 may monitor the level of the supply voltage VCC. The voltage drop detecting unit 134 may determine whether the level of the supply voltage VCC has been lowered to a preset reference level. If the level of the supply voltage VCC has been lowered to the preset reference level, the voltage drop detecting unit 134 may output a detection signal DETECT. Here, the reference level may be higher than another reference level used for determining the expectation of an SPO event.

The voltage drop information processing unit 133 may receive a detection signal DETECT from the voltage drop detecting unit 134. The voltage drop information processing unit 133 may store voltage drop information VOLTAGE DROP INFO to the status register 132 based on the detection signal DETECT.

For example, if the detection signal DETECT is input, the voltage drop information processing unit 133 may store set voltage drop information VOLTAGE DROP INFO to the status register 132. Alternatively, if the detection signal DETECT is not input, the voltage drop information processing unit 133 may store released voltage drop information VOLTAGE DROP INFO to the status register 132.

If the voltage drop information VOLTAGE DROP INFO is set, it may indicate that a voltage drop has occurred in the supply voltage VCC while a corresponding operation is performed. If the voltage drop information VOLTAGE DROP INFO is released, it may indicate that a voltage drop has not occurred in the supply voltage VCC while the corresponding operation is performed. In an embodiment, the set voltage drop information VOLTAGE DROP INFO may be indicated as '0', and the released voltage drop information VOLTAGE DROP INFO may be indicated as '1'. Alternatively, the set voltage drop information VOLTAGE DROP INFO may be indicated as '1', and the released voltage drop information VOLTAGE DROP INFO may be indicated as '0'.

Figure 3:
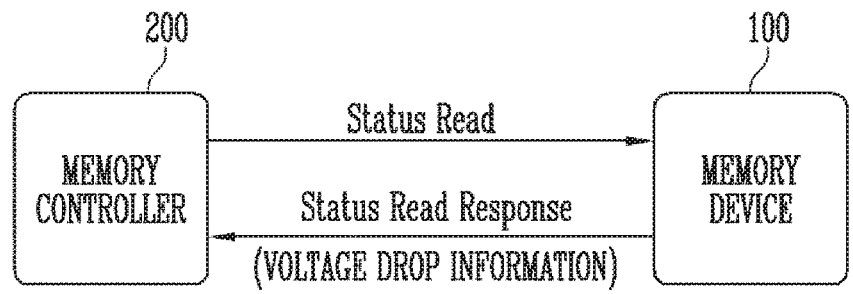
FIG. 3 is a diagram illustrating data communication between a memory controller and a memory device in accordance with an embodiment of the present disclosure.

FIG. 3 is a diagram illustrating data communication between the memory controller 200 and the memory device 100 in accordance with an embodiment of the present disclosure.

Referring to FIG. 3, if a preset time has passed after the memory controller 200 has provided a program command or an erase command to the memory device 100, the memory controller 200 may provide a status read command Status Read to the memory device 100.

The status read command Status Read may be a command for requesting the value of the status register that stores status information that indicates the operating status of the memory device 100. In detail, the memory device 100 may update the status register (not shown) included in the memory device 100, depending on the operating status of the memory device 100.

When the status read command Status Read is received, the memory device 100 may provide, in response to the status read command Status Read, a value stored in the status register to the memory controller 200 as a status read response.

In an embodiment of the present disclosure, the memory device 100 may generate voltage drop information VOLTAGE DROP INFO indicating whether a voltage drop has occurred while the memory device 100 performs an operation. The voltage drop information VOLTAGE DROP INFO may form a value of the status register. For example, if a voltage drop has occurred, the memory device 100 may store set voltage drop information VOLTAGE DROP INFO to the status register. If no voltage drop has occurred, the memory device 100 may store released voltage drop information VOLTAGE DROP INFO to the status register. The memory device 100 may provide a status register value including the voltage drop information VOLTAGE DROP INFO to the memory controller 200 as a status read response that is a response to the status read command Status Read.

Figure 4:
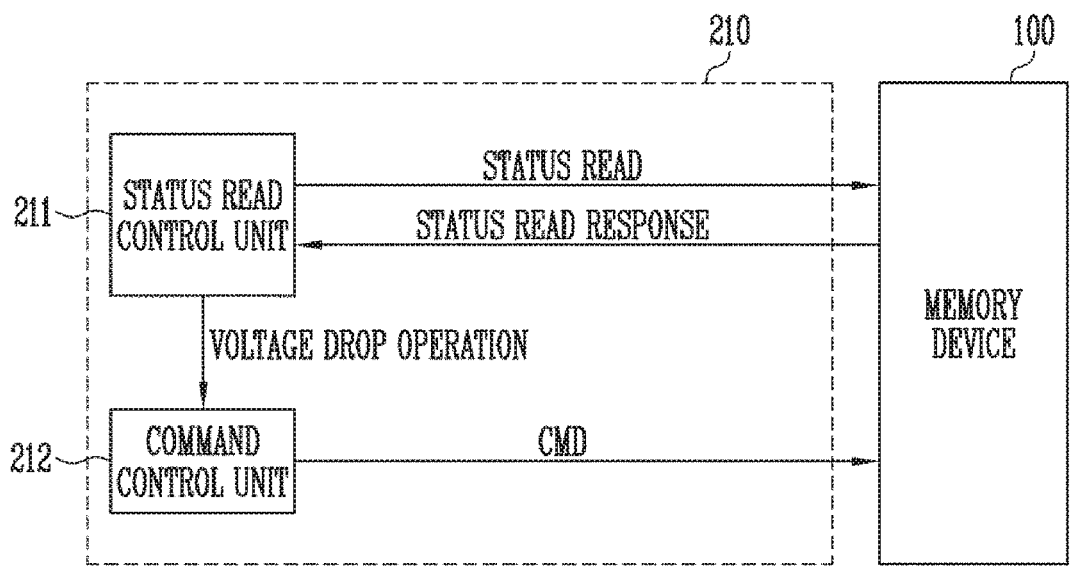
FIG. 4 is a diagram illustrating an operation of a voltage drop operation control unit of the memory controller shown in FIG. 1.

FIG. 4 is a diagram illustrating an operation of the voltage drop operation control unit 210 of the memory controller 200 of FIG. 1.

Referring to FIG. 4, the voltage drop operation control unit 210 may include a status read control unit 211 and a command control unit 212. The status read control unit 211 and the command control unit 212 may include all circuits, systems, firmware and devices necessary for their respective operations and functions.

If a preset time has passed after the status read control unit 211 has provided a program command or an erase command to the memory device 100, the status read control unit 211 may provide a status read command Status Read to the memory device 100.

The status read command Status Read may be a command which requests a value of the status register that stores status information that indicates the operating status of the memory device 100. In detail, the memory device 100 may update the status register (not shown) included in the memory device 100, depending on the operating status of the memory device 100.

When the status read command Status Read is received, the memory device 100 may provide, in response to the status read command Status Read, a value stored in the status register to the memory controller 200 as a status read response. The status read control unit 211 may receive the status read response provided from the memory device 100 in response to the status read command Status Read.

Based on the voltage drop information VOLTAGE DROP INFO included in the status read response, the status read control unit 211 may determine whether a voltage drop has occurred while an operation corresponding to a program command or an erase command provided from the memory controller 200 to the memory device 100 is performed. In other words, the status read control unit 211 may determine whether the operation corresponding to the program command or the erase command provided from the memory controller 200 to the memory device 100 is a voltage drop operation during which a voltage drop has occurred.

If the operation corresponding to the program command or the erase command provided from the memory controller 200 to the memory device 100 is a voltage drop operation, the status read control unit 211 may notify the command control unit 212 that the operation corresponding to the program command or the erase command provided from the memory controller 200 to the memory device 100 is a voltage drop operation (as shown by "VOLTAGE DROP OPERATION").

If the operation corresponding to the program command or the erase command provided from the memory controller 200 to the memory device 100 is a voltage drop operation, the command control unit 212 may perform an error processing operation for the voltage drop operation. For example, the command control unit 212 may provide, to the memory device 100, a different command CMD depending on whether the voltage drop operation is a program operation or an erase operation.

In an embodiment, if the voltage drop operation is a program operation, in order to determine whether data corresponding to the voltage drop operation has been successfully stored to the memory device 100, the command control unit 212 may provide, to the memory device 100, a read command for reading the programmed data corresponding to the voltage drop operation. If a read operation of reading the programmed data is successful, it may be determined that the voltage drop operation has been normally performed. However, if the read operation has failed, it may be determined that the voltage drop operation has been abnormally performed due to the voltage drop. In this case, the command control unit 212 may control the memory device 100 to re-perform the voltage drop operation or the program operation on another memory region.

In an embodiment, if the voltage drop operation is an erase operation, in order to determine whether a memory block has been normally erased according to the voltage drop operation, the command control unit 212 may provide, to the memory device 100, a read command for the corresponding memory block. A read voltage used in this case may be an erase verify voltage which is used in the erase operation. If the read operation using the erase verify voltage is successful, it may be determined that the voltage drop operation has been normally performed. If the read operation has failed, the command control unit 212 may control the memory device 100 to re-perform the voltage drop operation or the erase operation on the corresponding memory block.

Figure 5:
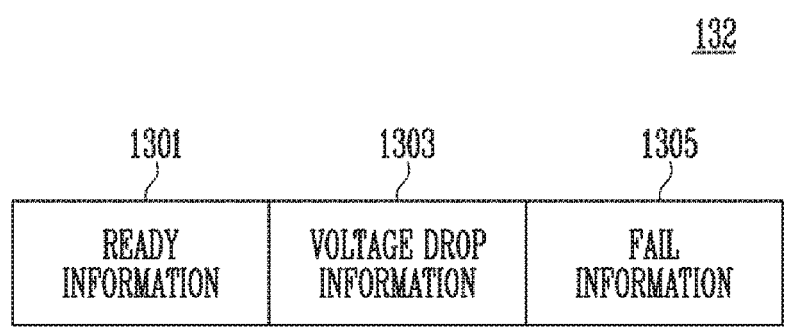
FIG. 5 is a diagram illustrating a status register shown in FIG. 2.

FIG. 5 is a diagram illustrating the status register 132 of FIG. 2.

The status register 132 may store status information indicating the operating status of the memory device. Values of data stored in the status register 132 may vary depending on the type of operation.

Referring to FIG. 5, data stored in the status register 132 may include ready information 1301, voltage drop information 1303, and fail information 1305.

The ready information 1301 may indicate that the memory device is ready for a new command. In an embodiment, the ready information 1301 may indicate that reception of a new command is possible, and an operation corresponding to a previously received command has been completed. The memory controller 200 may determine whether the operation corresponding to the command that has been previously provided has been completed, using the ready information 1301.

The voltage drop information 1303 may be information indicating whether a voltage drop has occurred while the memory device performs an operation. In detail, if the voltage drop information 1303 is set, it may indicate that a voltage drop has occurred while the memory device performs an operation. If the voltage drop information is released, it may indicate that no voltage drop has occurred while the memory device performs the operation. In an embodiment, the set voltage drop information 1303 may be indicated as '0', and the released voltage drop information 1303 may be indicated as '1'. Alternatively, the set voltage drop information 1303 may be indicated as '1', and the released voltage drop information 1303 may be indicated as '0'.

The fail information 1305 may indicate that an operation corresponding to a latest command has failed. In an embodiment, the fail information 1305 may have a valid value only for a program operation or an erase operation. In various embodiments, the fail information 1305 may indicate that an operation corresponding to a command received prior to the latest command has failed.

Figure 6:
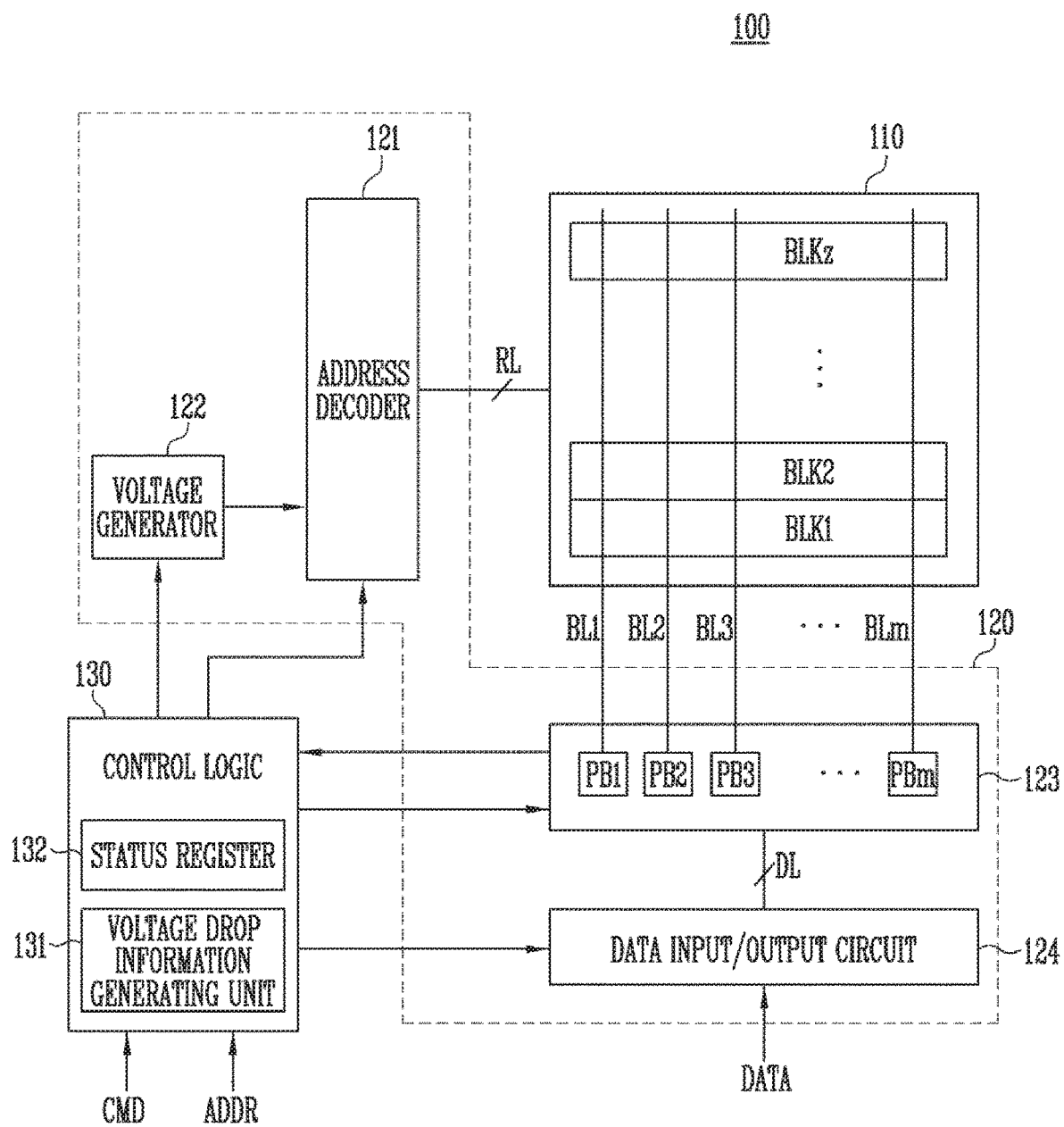
FIG. 6 is a diagram illustrating a configuration of the memory device shown in FIG. 1.

FIG. 6 is a diagram illustrating a configuration of the memory device 100 of FIG. 1.

Referring to FIG. 6, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to an address decoder 121 through row lines RL. The memory blocks BLK1 to BLKz may be coupled to a read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 is formed of a plurality of pages. In an embodiment, each of the memory blocks BLK1 to BLKz included in the memory cell array 110 may include a plurality of dummy cells. Here, one or more dummy cells may be coupled in series between a drain select transistor and the memory cells, and between a source select transistor and the memory cells.

Each of the memory cells of the memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, a read/write circuit 123, and a data input/output circuit 124.

The peripheral circuit 120 may drive the memory cell array 110. For example, the peripheral circuit 120 may drive the memory cell array 110 so as to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under control of the control logic 130. The address decoder 121 receives addresses ADDR from the control logic 130.

The address decoder 121 may decode a block address among the received addresses ADDR. The address decoder 121 selects at least one of the memory blocks BLK1 to BLKz according to the decoded block address. The address decoder 121 may decode a row address among the received addresses ADDR. The address decoder 121 may select at least one word line WL of the selected memory block by applying voltages supplied from the voltage generator 122 to at least one word line WL according to the decoded row address.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage higher than the verify voltage to unselected word lines.

During a read operation, the address decoder 121 may apply a read voltage to a selected word line and apply a read pass voltage higher than the read voltage to unselected word lines.

In an embodiment, an erase operation of the memory device 100 may be performed on a memory block basis. During the erase operation, an address ADDR to be inputted to the memory device 100 includes a block address. The address decoder 121 may decode the block address and select a corresponding one memory block according to the decoded block address. During the erase operation, the address decoder 121 may apply a ground voltage to word lines coupled to the selected memory block.

In an embodiment, the address decoder 121 may decode a column address among the transmitted addresses ADDR. The decoded column address may be transmitted to the read/write circuit 123. In an embodiment, the address decoder 121 may include components such as a row decoder, a column decoder, and an address buffer.

The voltage generator 122 may generate a plurality of voltages using an external supply voltage supplied to the memory device 100. The voltage generator 122 may operate under control of the control logic 130.

In an embodiment, the voltage generator (122) may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using the external supply voltage or the internal supply voltage. The voltage generator 122 may generate various voltages required in the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors configured to receive an internal supply voltage in order to generate a plurality of voltages having various voltage levels, and may generate a plurality of voltages by selectively enabling the plurality of pumping capacitors under control of the control logic 130.

The generated voltages may be supplied to the memory cell array 110 by the address decoder 121.

The read/write circuit 123 may include first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may operate under control of the control logic 130.

The first to m-th page buffers PB1 to PBm may perform data communication with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program allowable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read data from selected memory cells through the bit lines BL1 to BLm in order to determine whether the threshold voltages of the memory cells exceed a verify voltage.

During a read operation, the read/write circuit 123 may read data DATA from the memory cells of the selected page through the bit lines BL, and store the read data DATA to the first to the m-th page buffers PB1 to PBm.

During an erase operation, the read/write circuit 123 may float the bit lines BL. In an embodiment, the read/write circuit 123 may include a row select circuit.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not shown) which receive input data. During a program operation, the data input/output circuit 124 may receive data DATA to be stored from an external controller (not shown). During a read operation, the data input/output circuit 124 may output data, transmitted from the first to m-th page buffers PB1 to PBm included in the read/write circuit 123, to the external controller.

The control logic 130 may be coupled to the address decoder 121, the voltage generator 122, the read/write circuit 123, and the data input/output circuit 124. The control logic 130 may control the overall operation of the memory device 100. The control logic 130 may operate in response to a command CMD transmitted from an external device.

In an embodiment, the control logic 130 may further include a voltage drop information generating unit 131 and a status register 132. The voltage drop information generating unit 131 and the status register 132 may be respectively the voltage drop information generating unit 131 and the status register 132 that have been described with reference to FIG. 2.

Figure 7:
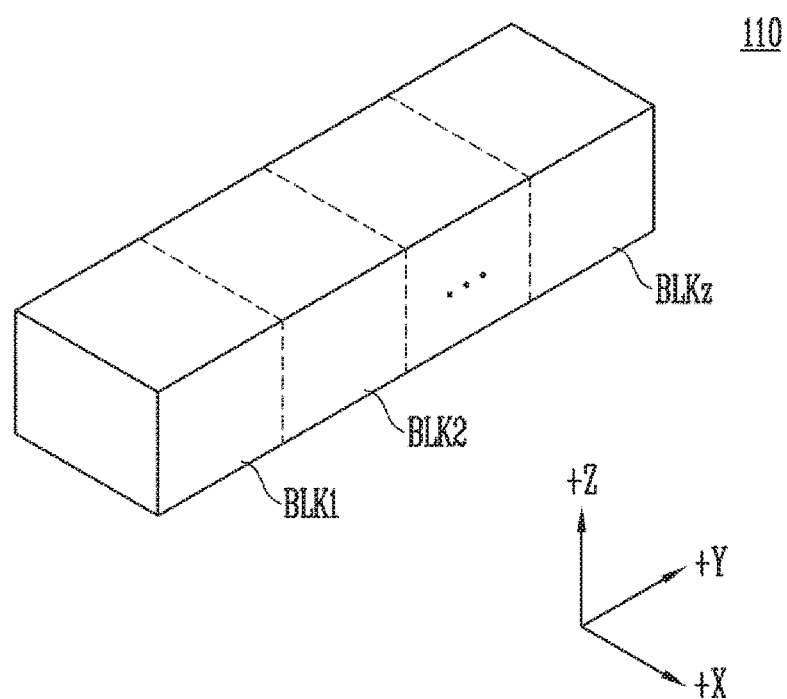
FIG. 7 is a diagram illustrating an embodiment of a memory cell array shown in FIG. 6.

FIG. 7 is a diagram illustrating an embodiment of the memory cell array 110 of FIG. 6.

Referring to FIG. 7, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 8 and 9.

Figure 8:
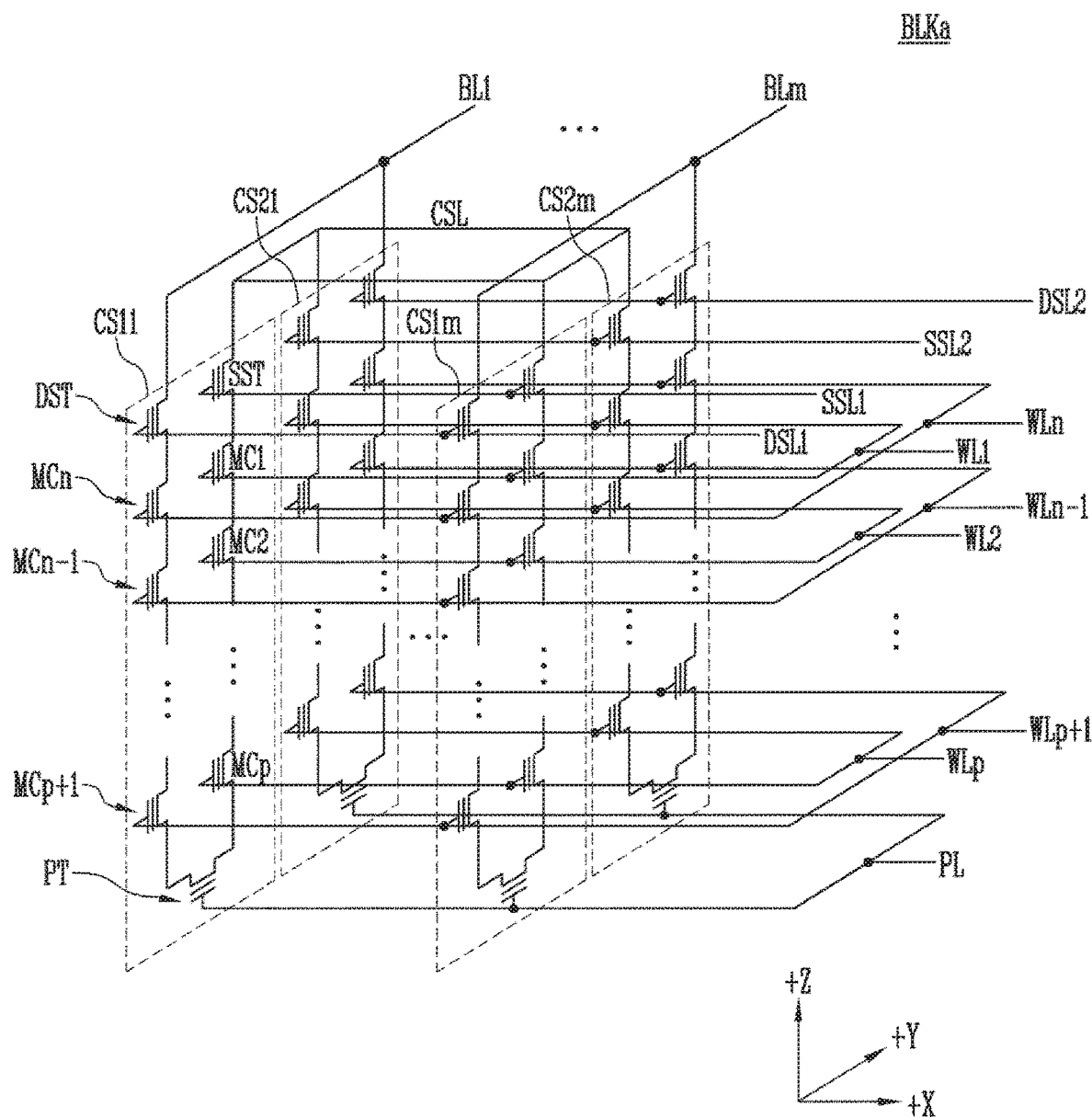
FIG. 8 is a circuit diagram illustrating any one of memory blocks shown in FIG. 7, in accordance with an embodiment of the present disclosure.

FIG. 8 is a circuit diagram illustrating any one BLKa of memory blocks BLK1 to BLKz of FIG. 7, in accordance with an embodiment of the present disclosure.

Referring to FIG. 8, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 8, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have structures similar to each other. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 8, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+i-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 8, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. One page may be selected from among the selected cell strings by selecting any one of the word lines WL1 to WLn.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to respective even bit lines. Odd-number-th cell strings of the cell strings CS11 to CS1*m* or CS21 to CS2*m* arranged in the row direction may be coupled to respective odd bit lines.

In an embodiment, at least one or more of the first to n-th memory cells MC1 to MCn may be used as a dummy memory cell. For example, the at least one or more dummy memory cells may be provided to reduce an electric field between the source select transistor SST and the memory cells MC1 to MCp. Alternatively, the at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 9:
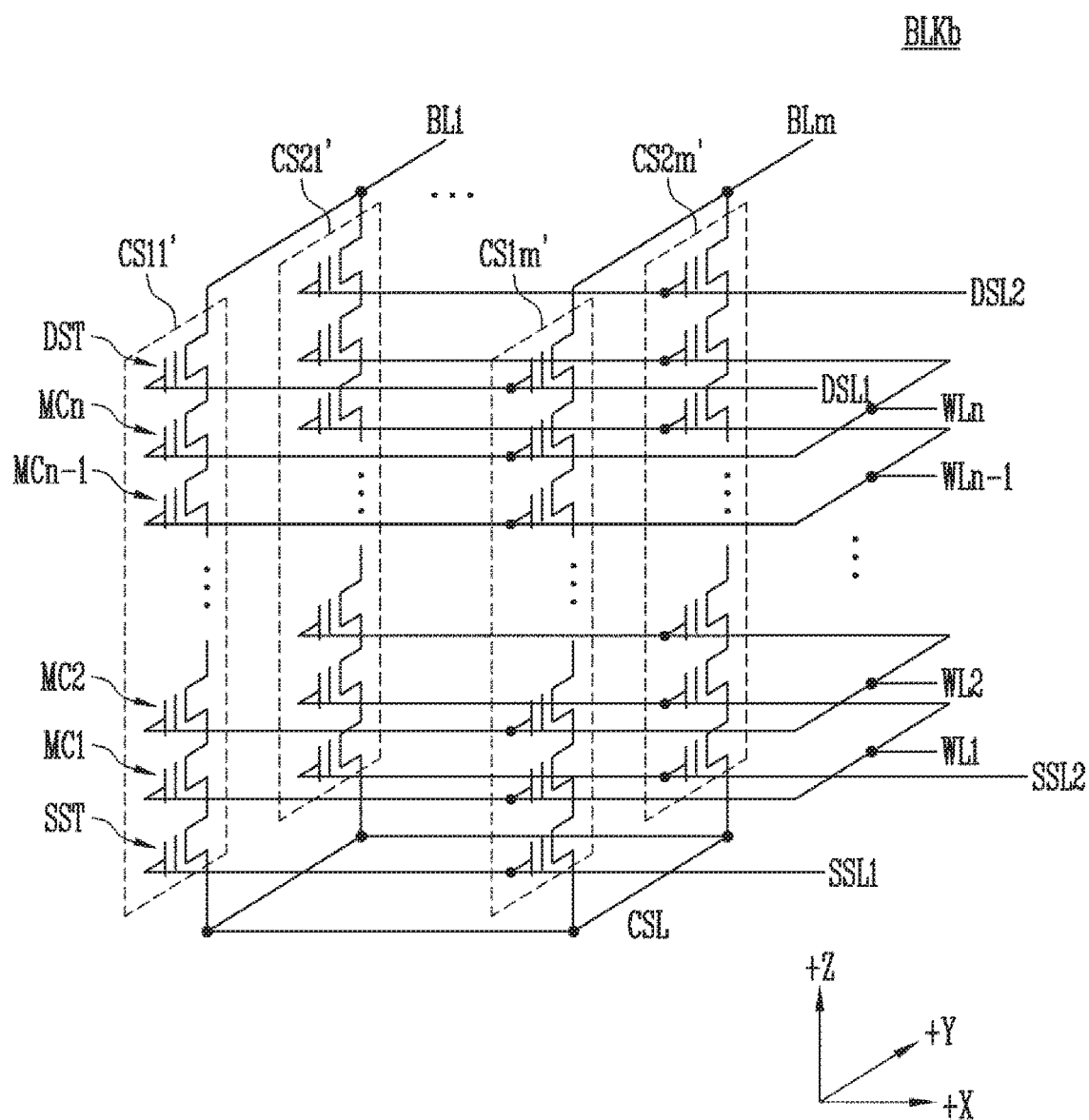
FIG. 9 is a circuit diagram illustrating any one of the memory blocks shown in FIG. 7, in accordance with an embodiment of the present disclosure.

FIG. 9 is a circuit diagram illustrating any one BLKb of the memory blocks BLK1 to BLKz of FIG. 7, in accordance with an embodiment of the present disclosure.

Referring to FIG. 9, a memory block BLKb may include a plurality of cell strings CS11' to CS1*m*' and CS21' to CS2*m*'. Each of the cell strings CS11' to CS1*m*' and CS21' to CS2*m*' extends in the +Z direction. Each of the cell strings CS11' to CS1*m*' and CS21' to CS2*m*' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1*m*' arranged in a first row may be coupled to a first source select line SSL1. Source select transistors of the cell strings CS21' to CS2*m*' arranged in a second row may be coupled to a second source select line SSL2. In an embodiment, source select transistors of the cell strings CS11' to CS1*m*' and CS21' to CS2*m*' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1*m*' in the first row are coupled to a first drain select line DSL1. Drain select transistors of the cell strings CS21' to CS2*m*' in the second row may be coupled to a second drain select line DSL2.

Consequentially, the memory block BLKb of FIG. 9 may have an equivalent circuit similar to that of the memory block BLKa of FIG. 8 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1*m*' or CS21' to CS2*m*' arranged in the row direction may be coupled to the respective even bit lines, and odd-number-th cell strings among the cell strings CS11' to CS1*m*' or CS21' to CS2*m*' arranged in the row direction may be coupled to the respective odd bit lines.

In an embodiment, at least one or more of the first to n-th memory cells MC1 to MCn may be used as a dummy memory cell. For example, the at least one or more dummy memory cells may be provided to reduce an electric field between the source select transistor SST and the memory cells MC1 to MCn. Alternatively, the at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 10:
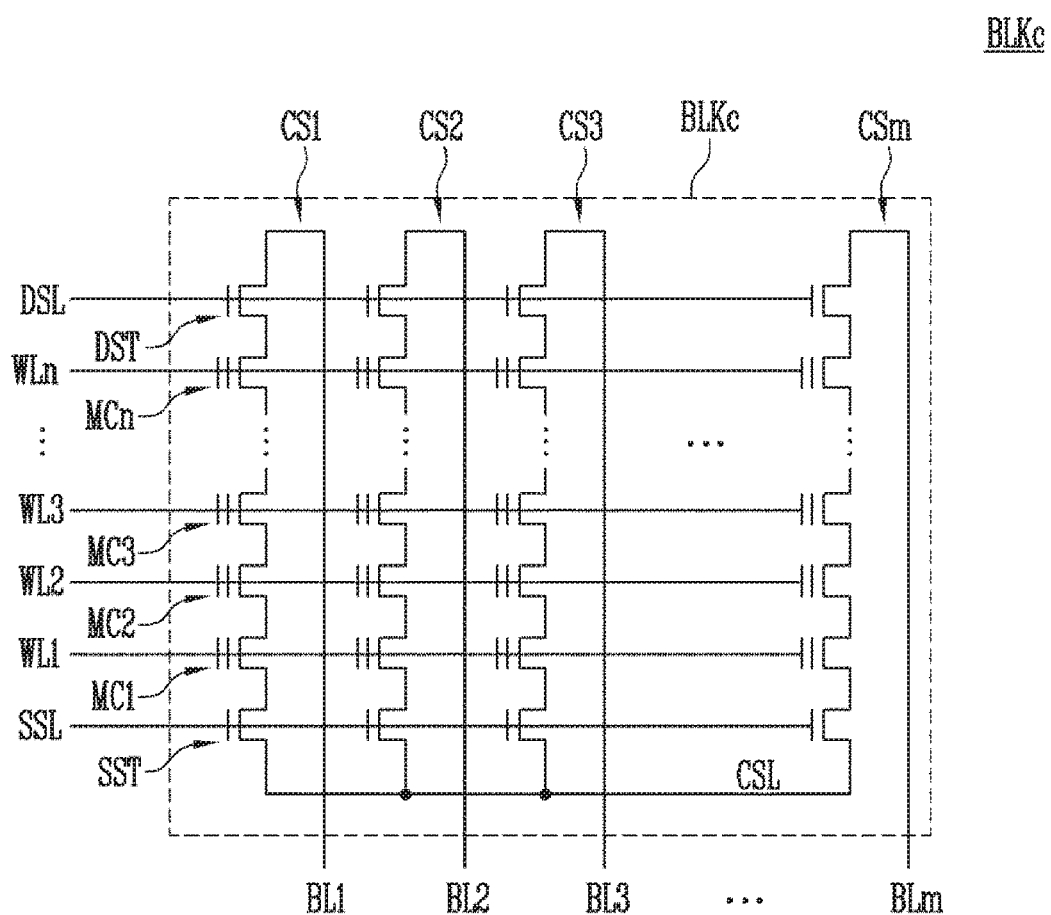
FIG. 10 is a circuit diagram illustrating an embodiment of a memory cell array shown in FIG. 6.

FIG. 10 is a circuit diagram illustrating an embodiment of a memory cell array of FIG. 6.

Referring to FIG. 10, the memory cell array may have a two-dimensional planar structure rather than having a three-dimensional structure described with reference to FIGS. 7 to 9.

In FIG. 10, the memory block BLKc includes a plurality of cell strings CS1 to CSm. The plurality of cell strings CS1 to CSm may be respectively coupled to a plurality of bit lines BL1 to BLm. Each of the cell strings CS1 to CSm includes at least one source select transistor SST, first to n-th memory cells MC1 to MCn, and at least one drain select transistor DST.

The select transistors SST and DST and the memory cells MC1 to MCn may have structures similar to each other. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

Memory cells coupled to the same word line may form a single page. The cell strings CS1 to CSm may be selected by selecting the drain select line DSL. One page may be selected from among the selected cell strings by selecting any one of the word lines WL1 to WLn.

In an embodiment, even bit lines and odd bit lines may be provided in lieu of the first to m-th bit lines BL1 to BLm. Even-number-th cell strings of the cell strings CS1 to CSm may be coupled to the respective even bit lines, and odd-number-th cell strings may be coupled to the respective odd bit lines.

Figure 11:
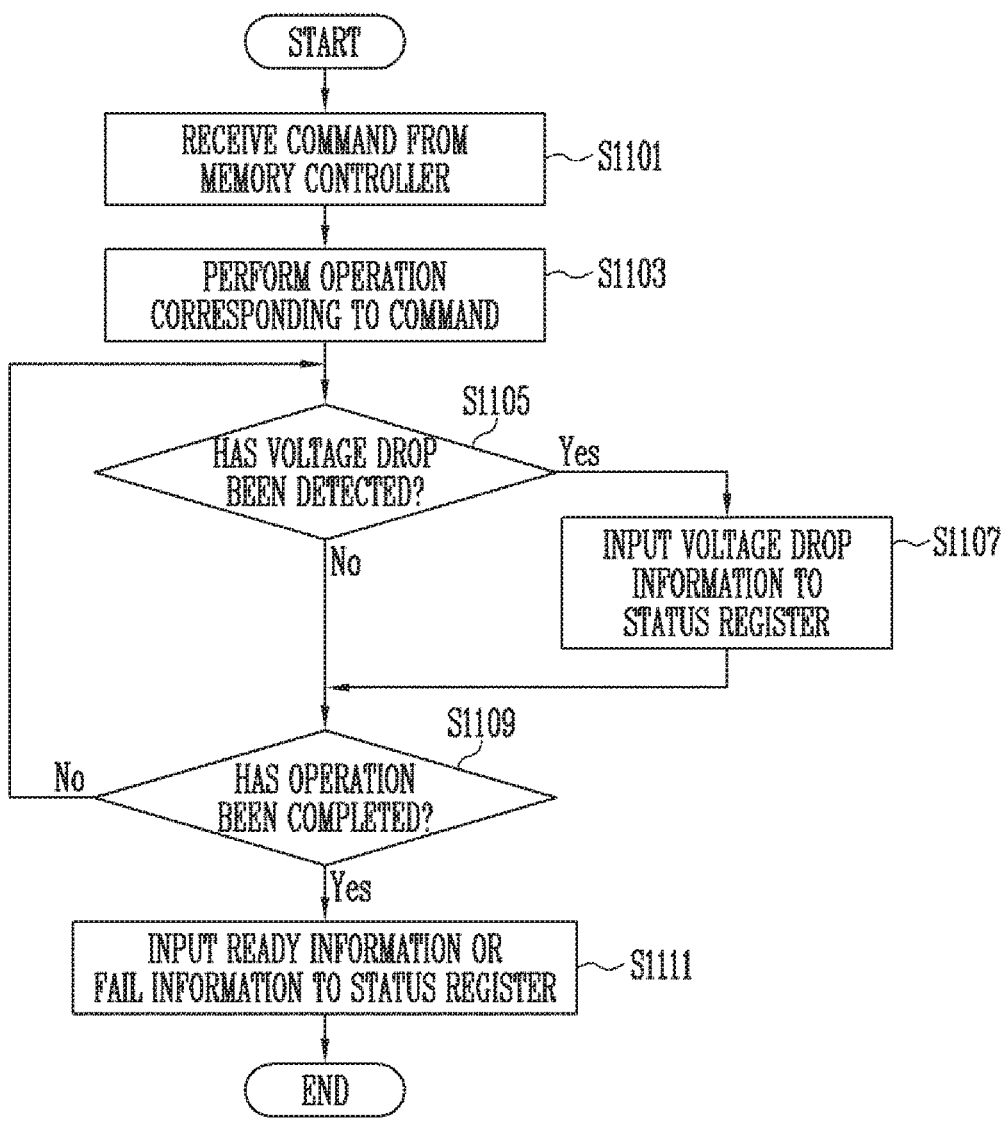
FIG. 11 is a flowchart illustrating an operation of the memory device in accordance with an embodiment of the present disclosure.

FIG. 11 is a flowchart illustrating an operation of the memory device 100 in accordance with an embodiment of the present disclosure.

Referring to FIG. 11, at step S1101, the memory device 100 may receive a command from the memory controller 200. For example, the command may be either a program command or an erase command.

At step S1103, the memory device 100 may perform an operation corresponding to the received command. For instance, if the received command is a program command, the memory device 100 may perform a program operation of storing data received along with the command to a memory region corresponding to an address received along with the command. Alternatively, if the received command is an erase command, the memory device 100 may perform an erase operation on a memory block corresponding to a block address received along with the erase command.

At step S1105, the memory device 100 may determine whether a voltage drop has been detected. In detail, the memory device 100 may monitor the level of the supply voltage VCC. In other words, the memory device 100 may determine whether the level of the supply voltage VCC has been lowered to a preset reference level. If the level of the supply voltage VCC has been lowered to the reference level, the memory device 100 may detect a voltage drop. If the voltage drop is detected, the process may proceed to step S1107. If the voltage drop is not detected, the process may proceed to step S1109.

At step S1107, the memory device 100 may store voltage drop information to the status register. For example, the memory device 100 may store set voltage drop information to the status register.

At step S1109, the memory device 100 may determine whether the execution of the operation has been completed. If data is stored to memory cells of the memory region corresponding to the program command, the process may proceed to step S1111. If the program operation is being performed, the process may return to step S1105. Alternatively, if the erase operation has been completed, the process may proceed to step S1111. If the erase operation is being performed, the process may return to step S1105. That is, the memory device 100 may continuously monitor whether a voltage drop has been detected, at step S1105, until the execution of the corresponding operation is completed.

At step S1111, the memory device 100 may update the ready information or the fail information that is stored in the status register. In an embodiment, the ready information may indicate that reception of a new command is possible and an operation corresponding to a previously received command has been completed. The fail information may indicate that an operation corresponding to a latest command has failed.

Figure 12:
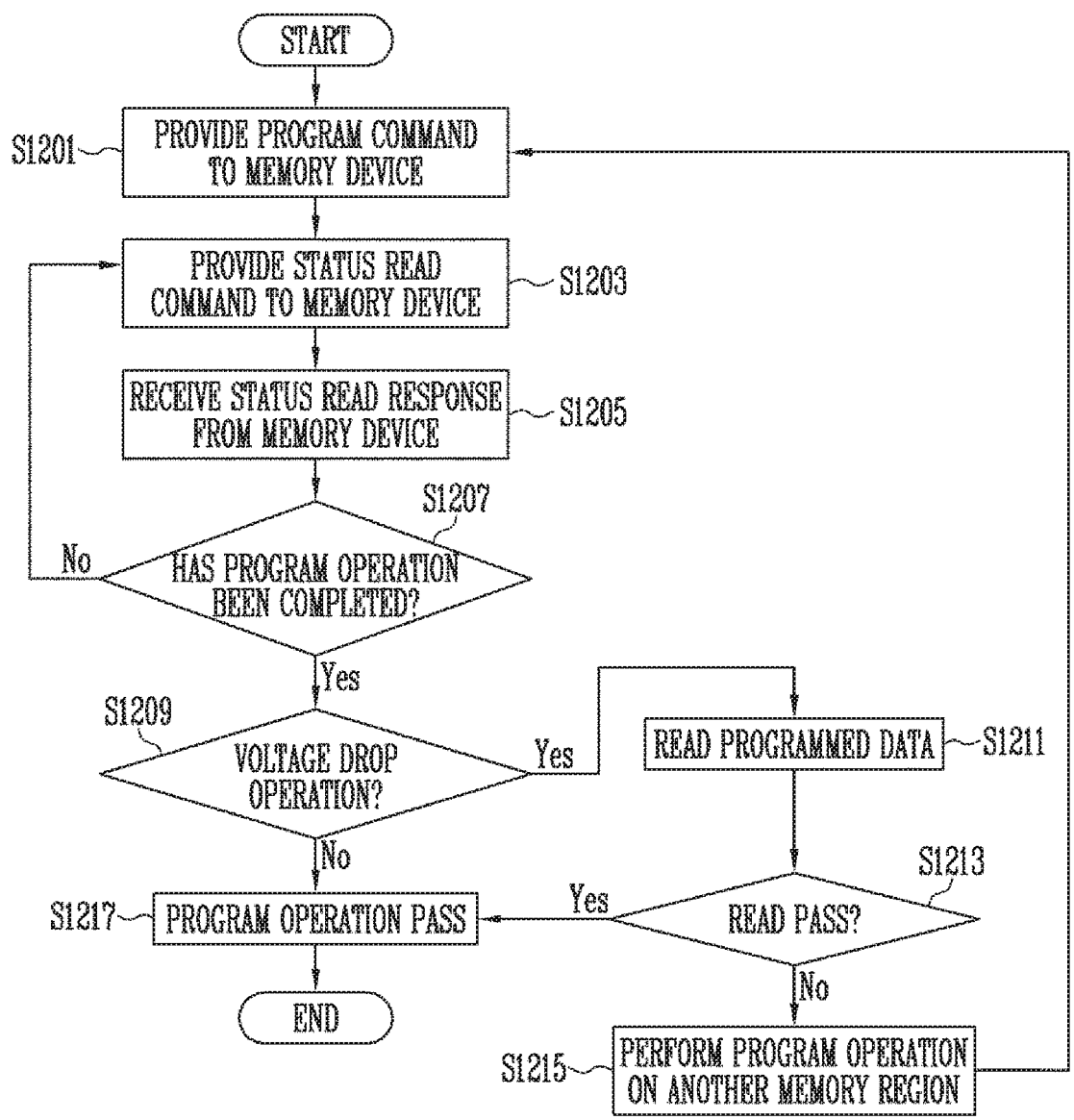
FIG. 12 is a flowchart illustrating an operation of the memory controller in accordance with an embodiment of the present disclosure.

FIG. 12 is a flowchart illustrating an operation of the memory controller 200 in accordance with an embodiment of the present disclosure.

Referring to FIG. 12, at step S1201, the memory controller 200 may provide a program command to the memory device 100. When providing the program command to the memory device 100, the memory controller 200 may provide program data, which is data to be programmed, and a program address indicating a memory region on which the program data is to be programmed, together with the program command.

At step S1203, the memory controller 200 may provide a status read command to the memory device 100. In an embodiment, if a preset time has passed after the program command has been provided at step S1201, the memory controller 200 may provide the status read command to the memory device 100, at step S1203. The status read command may be a command for requesting the value of the status register that stores status information indicating the operating status of the memory device 100.

At step S1205, the memory controller 200 may receive a status read response provided from the memory device 100. The status read response provided from the memory device 100 may be a value stored in the status register.

At step S1207, the memory controller 200 may determine whether the program operation has been completed, based on the status information included in the status read response provided from the memory device 100. The status information may include ready information, voltage drop information, and fail information. The memory controller 200 may determine whether the memory device 100 has completed the program operation, based on the ready information. As a result of the determination, if the program operation has not been completed, the process may return to step S1203. If the program operation has been completed, the process may proceed to step S1209.

At step S1209, the memory controller 200 may determine whether the completed program operation is a voltage drop operation. The voltage drop operation is the operation during which a voltage drop has occurred in the memory device 100. The memory controller 200 may determine whether the program operation is the voltage drop operation, based on the voltage drop information included in the status information. As a result of the determination, if the program operation is a voltage drop operation, an error processing operation of steps S1211 to S1215 is performed. If the program operation is not a voltage drop operation, the process proceeds to step S1217.

At step S1211, the memory controller 200 may provide a read command for reading programmed data to the memory device 100 in order to determine whether the voltage drop operation has been normally performed. Thereafter, according to the read command, the memory device 100 may read the data corresponding to the voltage drop operation.

At step S1213, the memory controller 200 may determine whether the read operation is successful. In detail, the memory device 100 may provide the read data to the memory controller 200 under control of the memory controller 200. The memory controller 200 may perform an error correction code (ECC) decoding operation on the read data. If the decoding operation succeeds, it may indicate that the read operation is successful. If the decoding operation fails, it may indicate that the read operation has failed. The case where the read operation is successful may be the case where, although a voltage drop has occurred, the voltage drop does not affect the voltage drop operation. Therefore, in this case, the process proceeds to step S1217. If the read operation has not passed, the process proceeds to step S1215.

At step S1215, the memory controller 200 may re-perform the voltage drop operation or the program operation on another memory region because the voltage drop operation has not been normally completed.

At step S1217, the memory controller 200 may output a program operation pass signal to the host because the corresponding program command has been normally performed.

Figure 13:
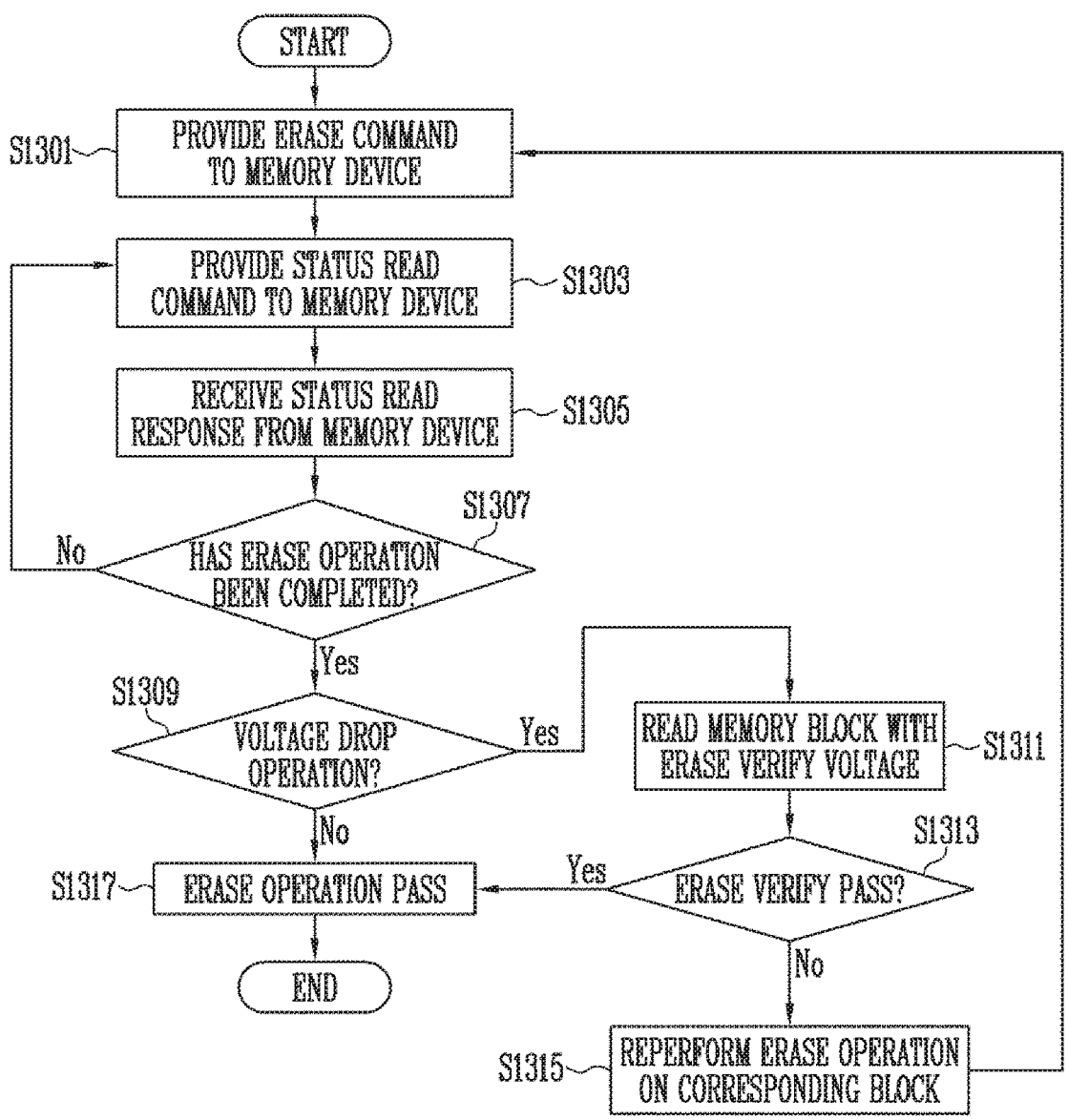
FIG. 13 is a flowchart illustrating an operation of the memory controller in accordance with an embodiment of the present disclosure.

FIG. 13 is a flowchart illustrating an operation of the memory controller 200 in accordance with an embodiment of the present disclosure.

Referring to FIG. 13, at step S1301, the memory controller 200 may provide an erase command to the memory device 100. When providing the erase command to the memory device 100, the memory controller 200 may provide an address indicating a memory region (memory block) to be erased, together with the erase command.

At step S1303, the memory controller 200 may provide a status read command to the memory device 100. In an embodiment, if a preset time has passed after the erase command has been provided at step S1301, the memory controller 200 may provide the status read command to the memory device 100, at step S1303. The status read command may be a command for requesting the value of the status register that stores the status information indicating the operating status of the memory device 100.

At step S1305, the memory controller 200 may receive a status read response provided from the memory device 100. The status read response provided from the memory device 100 may be a value stored in the status register.

At step S1307, the memory controller 200 may determine whether the erase operation has been completed, based on the status information included in the status read response provided from the memory device 100. The status information may include ready information, voltage drop information, and fail information. The memory controller 200 may determine whether the memory device 100 has completed the erase operation, based on the ready information. As a result of the determination, if the erase operation has not been completed, the process may return to step S1303. If the erase operation has been completed, the process may proceed to step S1309.

At step S1309, the memory controller 200 may determine whether the completed erase operation is a voltage drop operation. The voltage drop operation is the operation during which a voltage drop has occurred in the memory device 100. The memory controller 200 may determine whether the erase operation is the voltage drop operation, based on the voltage drop information included in the status information. As a result of the determination, if the erase operation is a voltage drop operation, an error processing operation of steps S1311 to S1315 is performed. If the erase operation is not a voltage drop operation, the process proceeds to step S1317.

At step 1311, in order to determine whether the memory block has been normally erased, the memory controller 200 may provide a read command for the corresponding memory block to the memory device 100. A read voltage used in this case may be an erase verify voltage which is used in the erase operation. In an embodiment, the memory controller 200 may perform a read operation using the erase verify voltage on at least one page among the plurality of pages included in the memory block.

At step S1313, the memory controller 200 may determine whether the erase verify operation is successful.

The case where the read operation using the erase verify voltage is successful may be the case where, although a voltage drop has occurred, the voltage drop does not affect the voltage drop operation. Therefore, in this case, the process proceeds to step S1317. If the erase verify operation has not passed, the process proceeds to step S1315.

At step S1315, the memory controller 200 may re-perform the voltage drop operation or the erase operation on the memory block because the voltage drop operation has not been normally completed.

At step S1317, the memory controller 200 may output an erase operation pass signal to the host because the corresponding erase command has been normally performed.

Figure 14:
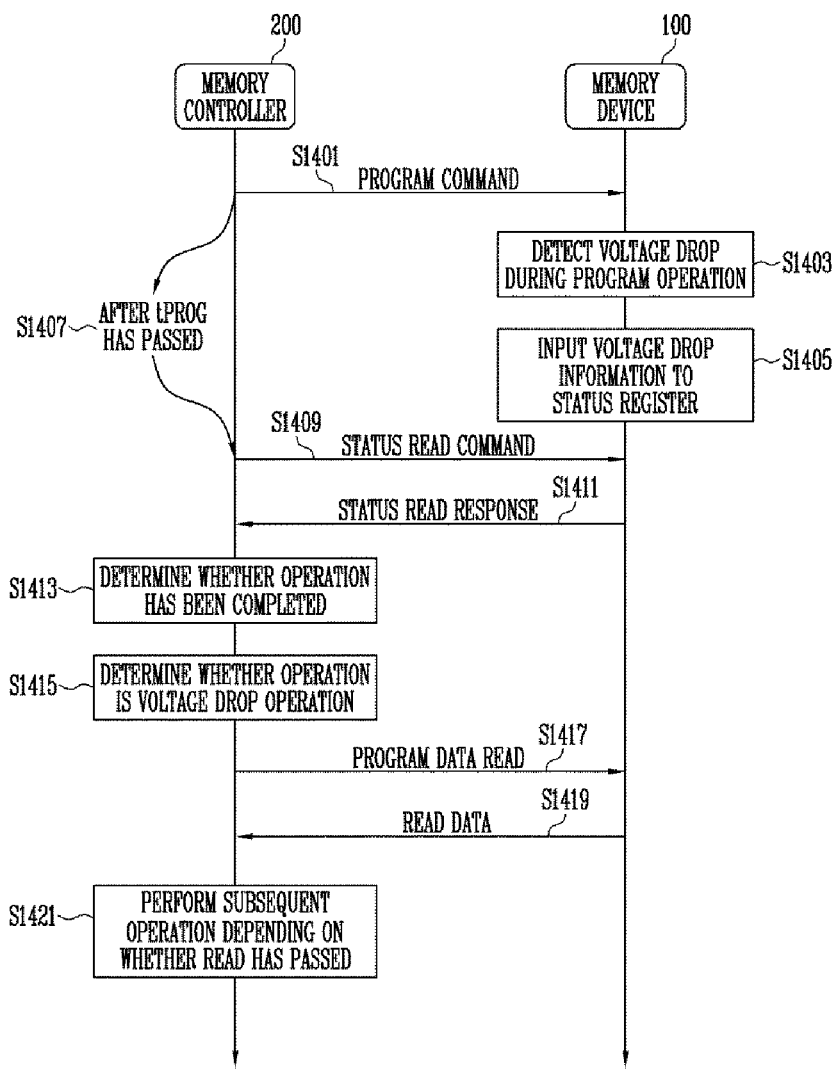
FIG. 14 is a flowchart illustrating an operation of the storage device in accordance with an embodiment of the present disclosure.

FIG. 14 is a flowchart illustrating an operation of the storage device 50 in accordance with an embodiment of the present disclosure.

Referring to FIG. 14, at step S1401, the memory controller 200 200 provides a program command to the memory device 100. When providing the program command to the memory device 100, the memory controller 200 may provide program data, which is data to be programmed, and a program address indicating a memory region on which the program data is to be programmed, together with the program command.

At step S1403, the memory device 100 may determine whether a voltage drop has been detected while the program operation is performed. In detail, the memory device 100 may monitor the level of the supply voltage VCC. In other words, the memory device 100 may determine whether the level of the supply voltage VCC has been lowered to a preset reference level. If the level of the supply voltage VCC has been lowered to the reference level, the memory device 100 may detect a voltage drop.

At step S1405, the memory device 100 may store voltage drop information to the status register. For example, the memory device 100 may store the set voltage drop information to the status register.

If, at step S1407, a preset time tPROG has passed, the memory controller 200 may proceed to step S1409 and provide a status read command to the memory device 100.

At step S1411, the memory device 100 may provide a value stored in the status register to the memory controller 200 as a status read response.

At step S1413, the memory controller 200 may determine whether the program operation has been completed, based on the status information included in the status read response provided from the memory device 100. The status information may include ready information, voltage drop information, and fail information. The memory controller 200 may determine whether the memory device 100 has completed the program operation, based on the ready information.

At step S1415, the memory controller 200 may determine whether the completed program operation is a voltage drop operation. The voltage drop operation is the operation during which a voltage drop has occurred in the memory device 100. The memory controller 200 may determine whether the program operation is the voltage drop operation, based on the voltage drop information included in the status information.

At step S1417, the memory controller 200 may provide a read command for reading programmed data to the memory device 100 in order to determine whether the voltage drop operation has been normally performed.

At step S1419, the memory device 100 may read the data corresponding to the voltage drop operation in response to the read command, and may provide the read data that is a result of the read operation to the memory controller 200.

At step S1421, the memory controller 200 may perform a subsequent operation depending on whether the read operation is successful. For example, if the read operation is successful, this refers to the case where, although a voltage drop has occurred, the voltage drop does not affect the voltage drop operation. Consequently, the memory controller 200 may determine that the voltage drop operation has been normally performed. If the read operation has not passed, the memory controller 200 may re-perform the voltage drop operation or the program operation on another memory region because the voltage drop operation has not been normally completed.

Figure 15:
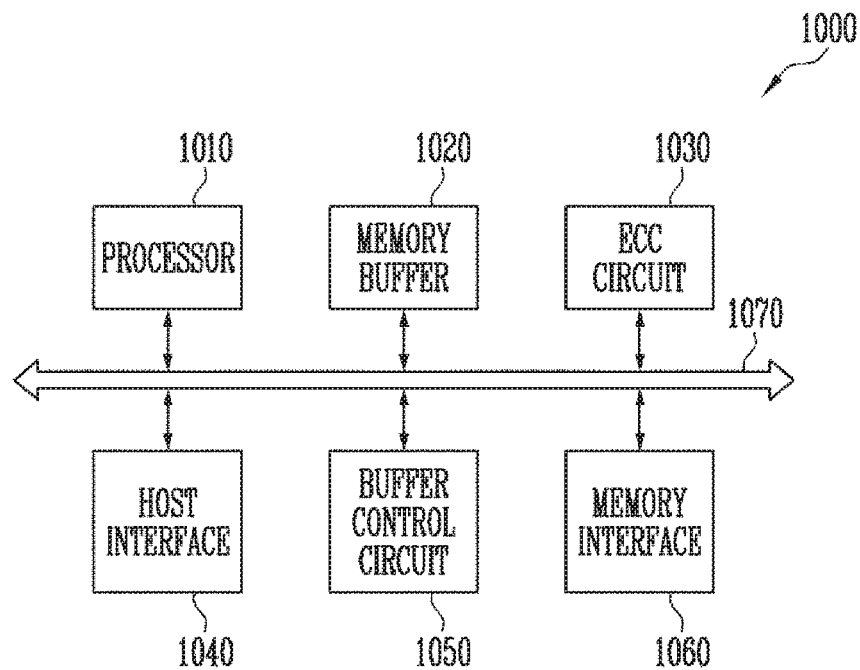
FIG. 15 is a diagram illustrating an embodiment of the memory controller shown in FIG. 1.

FIG. 15 is a diagram illustrating an embodiment of the memory controller of FIG. 1.

The memory controller 1000 is coupled to a host and the memory device. In response to a request from the host, the controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

Referring to FIG. 15, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device 50 using the memory buffer 1020 as an operation memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device 100 as data to be stored, and may be programmed to the memory cell array.

During a read operation, the processor 1010 may derandomize data received from the memory device 100. For example, the processor 1010 may use a derandomizing seed to derandomize data received from the memory device 100. Derandomized data may be output to the host.

In an embodiment, the processor 1010 may drive software or firmware to perform the randomizing operation or the derandomizing operation.

In an embodiment, the processor 1010 may perform the operation of the voltage drop operation control unit 210 described with reference to FIGS. 1 and 4.

The memory buffer circuit 1020 may be used as an operation memory, a cache memory, or a buffer memory of the processor 1010. The memory buffer circuit 1020 may store codes and commands to be executed by the processor 1010. The memory buffer circuit 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device 100 through the memory interface 1060. ECC encoded data may be transmitted to the memory device 100 through the memory interface 1060. The ECC circuit 1030 may perform an ECC decoding operation on data received from the memory device 100 through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device 100 through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device 100 through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 16:
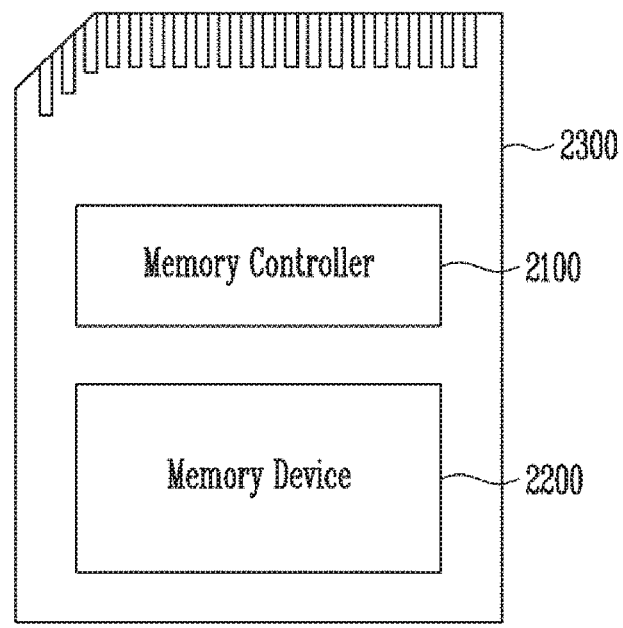
FIG. 16 is a block diagram illustrating a memory card system to which the storage device in accordance with an embodiment of the present disclosure is applied.

FIG. 16 is a block diagram illustrating a memory card system 2000 to which the storage device in accordance with an embodiment of the present disclosure is applied.

Referring FIG. 16, the memory card system 2000 may include a memory controller 2100, a memory device 2200 and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2200 and the host. The memory controller 2100 may drive firmware for controlling the memory device 2200. The memory controller 2100 may be embodied in the same manner as that of the memory controller 200 described with reference to FIG. 1.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The operation of the voltage drop operation control unit 210 described with reference to FIGS. 1 and 4 may be performed by the memory controller 2100.

For example, the memory controller 2100 or the memory device 2200 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP). Alternatively, the memory device 2200 may include a plurality of nonvolatile memory chips, and the plurality of nonvolatile memory chips may be packaged based on the above-mentioned package methods and provided as a single semiconductor package.

In an embodiment, the memory controller 2100 and the memory device 2200 may be integrated into a single semiconductor device. In an embodiment, the memory controller 2100 and the memory device 2200 may be integrated into a single semiconductor device to form a solid state drive (SSD). In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

For example, the memory device 2200 may be the memory device 100 described with reference to FIGS. 1 and 6.

Figure 17:
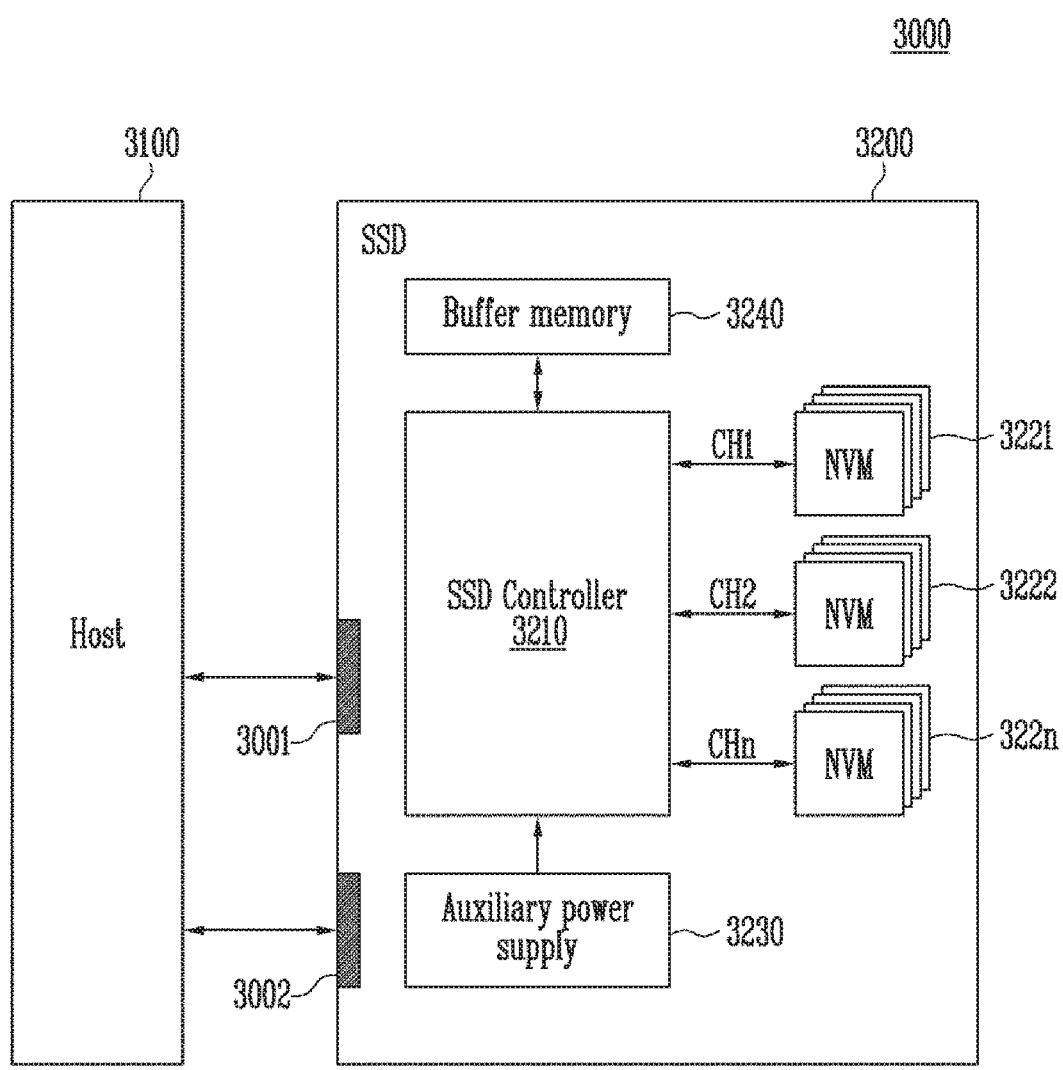
FIG. 17 is a block diagram illustrating a solid state drive (SSD) system to which the storage device in accordance with an embodiment of the present disclosure is applied.

FIG. 17 is a block diagram illustrating a solid state drive (SSD) system 3000 to which the storage device in accordance with an embodiment of the present disclosure is applied.

Referring to FIG. 17, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

For example, each of the nonvolatile memory devices 3221 to 322n may be the memory device 100 described with reference to FIGS. 1 and 6.

Figure 18:
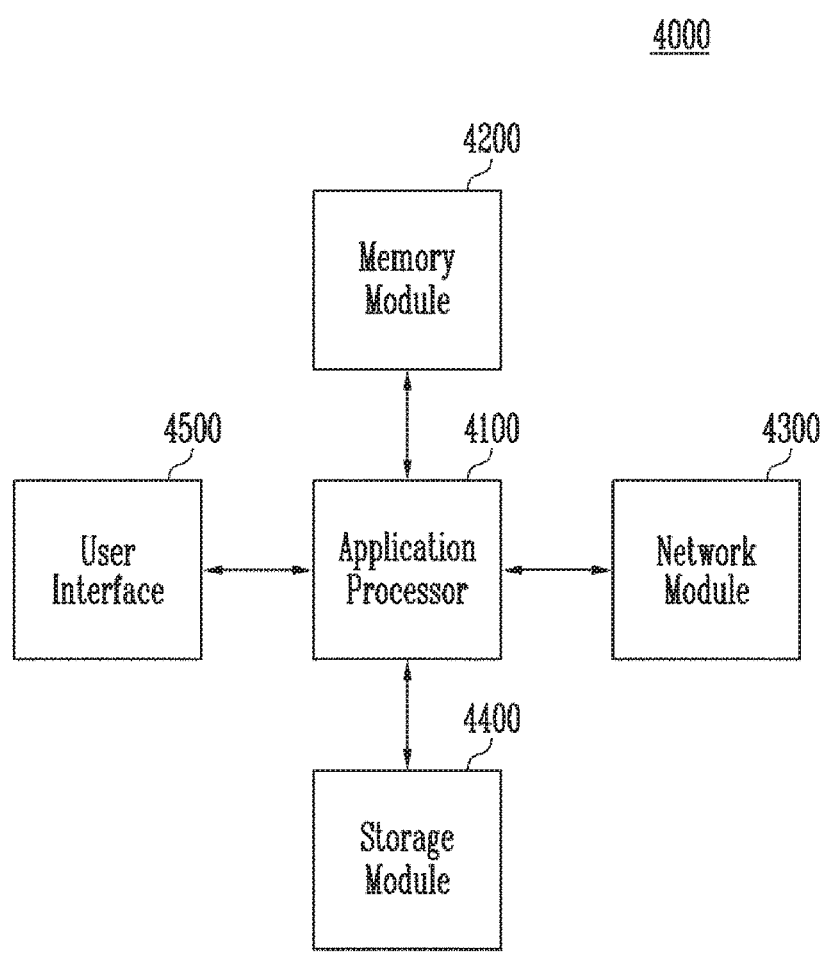
FIG. 18 is a block diagram illustrating a user system to which the storage device in accordance with an embodiment of the present disclosure is applied.

FIG. 18 is a block diagram illustrating a user system 4000 to which the storage device in accordance with an embodiment of the present disclosure is applied.

Referring to FIG. 18, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be the memory device 100 described above with reference to FIGS. 1 and 6.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and a motor.

Various embodiments of the present disclosure may provide a storage device capable of detecting a voltage drop, and a method of operating the storage device.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

In the above-discussed embodiments, all steps may be selectively performed or skipped. In addition, the steps in each embodiment may not always be sequentially performed in regular order, and may be performed in another order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory device comprising:
    a memory cell array including a plurality of memory cells;
    a peripheral circuit configured to perform an operation on selected memory cells among the plurality of memory cells;
    a voltage drop information generating unit configured to generate voltage drop information indicating whether a voltage drop has occurred in a supply voltage input from an external device while the operation is performed; and
    a status register configured to store
    status information about the memory device,
    the status information includes ready information on whether the operation has been completed and the voltage drop information, and
    the status information is requested by a memory controller after the operation is performed.

2. The memory device according to claim 1, wherein the voltage drop information generating unit comprises:
    a voltage drop detecting unit configured to generate a detection signal depending on whether the supply voltage has been lowered to a reference level; and
    a voltage drop information processing unit configured to set the voltage drop information depending on the detection signal.

3. The memory device according to claim 2, wherein the reference level is higher than a level of a detection voltage for detecting whether the supply voltage corresponds to a sudden power-off event.

4. The memory device according to claim 1,
wherein the status information includes fail information for indicating that an operation corresponding to a performed command has failed.

5. The memory device according to claim 4, wherein the voltage drop information has a set status when the voltage drop occurs, and has a released status when the voltage drop does not occur.

6. The memory device according to claim 1, wherein the operation is either a program operation or an erase operation.

7. A method for operating a memory controller, comprising:
providing, to a memory device, a command corresponding to an operation;
providing a status read command to the memory device when a preset time passes after the command is provided;
receiving a status read response output from the memory device in response to the status read command; and
determining whether the operation is a voltage drop operation in which a voltage drop has occurred in a supply voltage of the memory device while the operation is performed, depending on voltage drop information included in the status read response; and
performing an error processing operation for the operation if the operation is the voltage drop operation.

8. The method according to claim 7, wherein the status read command is a command for requesting a value of a status register stored in the memory device.

9. The method according to claim 7,
wherein the status read response includes status information of the memory device, and
wherein the status information includes ready information for indicating that reception of a new command is possible and an operation corresponding to a previously received command has been completed, the voltage drop information, and fail information for indicating that an operation corresponding to a performed command has failed.

10. The method according to claim 7, wherein the performing of the error processing operation comprises:
reading, when the operation is a program operation, a memory region on which the program operation has been performed; and
re-performing, when the read operation fails, the program operation on a memory region different from the memory region on which the program operation has been performed.

11. The method according to claim 7, wherein the performing of the error processing operation comprises:
performing, when the operation is an erase operation, an erase verify operation on a memory region on which the erase operation has been performed; and
re-performing, when the erase verify operation fails, an erase operation on the memory region on which the erase operation has been performed.

12. The method according to claim 7, wherein the operation is either a program operation or an erase operation.

13. A storage device comprising:
a memory device configured to store voltage drop information indicating whether a voltage drop occurred in a supply voltage while an operation is performed; and
a memory controller configured to provide, to the memory device, a status read command for requesting a result of the performing of the operation, determine whether the operation has passed, based on the voltage drop information included in a status read response provided from the memory device in response to the status read command, and to perform an error processing operation for the operation if the operation is the voltage drop operation.

* * * * *